(12) United States Patent
Suchoff

(10) Patent No.: US 8,907,678 B2
(45) Date of Patent: Dec. 9, 2014

(54) METHODS AND APPARATUS FOR SENSING GROUND LEAKAGE AND AUTOMATED SELF TESTING THEREOF

(75) Inventor: Michael Suchoff, Chapel Hill, NC (US)

(73) Assignee: Raritan Americas, Inc., Somerset, NJ (US)

(*) Notice: Subject to any disclaimer, the term of this patent is extended or adjusted under 35 U.S.C. 154(b) by 99 days.

(21) Appl. No.: 12/965,190

(22) Filed: Dec. 10, 2010

(65) Prior Publication Data

US 2012/0146655 A1 Jun. 14, 2012

(51) Int. Cl.
*G01R 31/14* (2006.01)
*H02H 3/28* (2006.01)
*G01R 31/02* (2006.01)
*H02H 3/33* (2006.01)
*G01R 35/00* (2006.01)

(52) U.S. Cl.
CPC ............. *G01R 31/025* (2013.01); *H02H 3/28* (2013.01); *H02H 3/335* (2013.01); *G01R 35/00* (2013.01)
USPC ............................ 324/509; 324/551; 361/42

(58) Field of Classification Search
USPC ......... 324/509, 500, 522, 713, 512, 528, 531, 324/541, 544, 555, 551; 702/58, 59, 185; 361/42, 63, 65, 88, 93.1
See application file for complete search history.

(56) References Cited

U.S. PATENT DOCUMENTS

| | | | | |
|---|---|---|---|---|
| 3,671,809 A * | 6/1972 | Ryan et al. | ...................... | 361/45 |
| 3,947,759 A * | 3/1976 | Briggs | .......................... | 324/509 |
| 4,532,568 A | 7/1985 | Kraus, Sr. | | |
| 4,809,123 A * | 2/1989 | Allington et al. | ............... | 361/42 |
| 5,600,524 A * | 2/1997 | Neiger et al. | .................... | 361/42 |
| 5,872,926 A | 2/1999 | Levac | | |
| 6,191,589 B1 | 2/2001 | Clunn | | |
| 6,593,751 B2 * | 7/2003 | Takahashi | ..................... | 324/551 |
| 6,593,767 B1 * | 7/2003 | Tanaka et al. | ............ | 324/765.01 |
| 6,807,035 B1 | 10/2004 | Baldwin | | |
| 7,468,871 B2 | 12/2008 | Jackson | | |
| 7,573,317 B2 * | 8/2009 | Lewis et al. | .................... | 327/534 |
| 8,320,089 B1 * | 11/2012 | Chelcun et al. | .................. | 361/42 |
| 2002/0101222 A1 * | 8/2002 | Lee | .............................. | 323/209 |
| 2006/0146456 A1 | 7/2006 | Williams | | |
| 2008/0180866 A1 * | 7/2008 | Wong | ............................. | 361/45 |
| 2011/0007443 A1 * | 1/2011 | Crookham et al. | .......... | 361/93.2 |

OTHER PUBLICATIONS

International Search Report for corresponding PCT Application No. PCT/US2011/64106, dated Apr. 9, 2012.
Written Opinion for corresponding PCT Application No. PCT/US2011/64106, dated Apr. 9, 2012.

* cited by examiner

*Primary Examiner* — Hoai-An D Nguyen
(74) *Attorney, Agent, or Firm* — Vorys, Sater, Seymour and Pease LLP; Vincent M DeLuca

(57) ABSTRACT

Methods and apparatus provide for: measuring leakage current from a source of AC power, which provides power to at least one load circuit; and comparing the measured leakage current values against one or more predetermined thresholds to establish status therefor; and automatically performing self tests to determine whether the leakage current sensing and comparing operations are operative.

15 Claims, 5 Drawing Sheets

100A

METHODS AND APPARATUS FOR SENSING GROUND LEAKAGE AND AUTOMATED SELF TESTING THEREOF

BACKGROUND OF THE INVENTION

The present invention relates to methods and apparatus for sensing leakage current in a system, and more particularly, to a circuit that is capable of sensing such leakage and also operates to perform self-testing to ensure proper sensing capability.

In alternating current (AC) power circuits, current from a single phase AC source normally flows from an AC source via a phase wire, through a load that is fed by the AC power, back through a neutral wire to the AC source, and vise verse. Any component of current that does not flow to the load via the phase wire and from the load via the neutral wire will flow via one or more leakage paths to earth ground. Such current is known as leakage or residual current. Leakage current is dangerous because it can lead to electrocution and/or fires if not properly controlled.

Ground Fault Interrupters (GFIs), which are also known as Residual Current Detectors (RCDs), are commonly available devices for detecting and interrupting leakage current flow. A diagram of a typical GFI circuit 10 is shown in FIG. 1. By way of example, a single phase AC source of power is provided by way of a phase wire L and a neutral wire N. The phase and neutral wires L, N are coupled to the load 14 (which in a residence may be an appliance of some kind), and AC current cycles from the source over the phase wire L, through the load 14, and back to the source via the neutral wire N, and vise verse.

The GFI circuit 10 includes a differential current transformer (T1), including a toroidal core through which the phase and neutral wires L, N pass. By passing through the current transformer, T1, the phase and neutral wires L, N function as the primary winding of T1. The secondary winding 12 includes a number of turns of wire wound around the core of the transformer T1. The secondary winding 12 is coupled to a circuit interrupter 16. The circuit interrupter 16 includes a control function 16A and a switch 16B, which is illustrated as a double pole, single throw (DPST) switch. The control function 16A operates to actuate (open) the DPST switch 16B when there is voltage present across, and/or current through, the secondary winding 12.

When there is no leakage current to earth ground, the sum of the respective AC currents in the phase and neutral wires L, N (through the primary winding) of the transformer T1 is zero. This results a net zero current flow in the primary of the transformer T1, which in turn results in no induced current in the secondary winding 12. Thus, the control function 16A does not open the DPST switch 16B and the AC current continues to flow through the load 14 from the AC source.

When there is leakage current to ground, however, the sum of the respective AC currents in the phase and neutral wires L, N (through the primary winding) of the transformer T1 is not zero. Indeed, for example, if some current were to flow from the AC source over the phase wire L, through earth ground, and back to the AC source, effectively bypassing the transformer T1, then there would be a greater magnitude AC current flowing over the phase wire L, through the primary of the transformer T1, than would return over the neutral wire N, through the primary of the transformer T1. The imbalance in current through the primary winding of the transformer T1 caused by the leakage current flow induces a current in the secondary winding 12 of the transformer T1. The induced current in the secondary winding 12 is sensed by the control function 16A and opens the DPST switch 16B, thereby interrupting the leakage current as well as the power to the load 14. In a typical GFI circuit 10, once the circuit interrupter 16 trips (the DPST switch 16B opens), the leakage path must be cleared, and a user must manually reset the switch 18B to the closed state.

In order to permit a user to verify that the GFI circuit 10 is operational, i.e., that an apparent zero primary winding current and/or zero secondary winding current is not due to a malfunction, the GFI circuit 10 includes a test feature. The test feature is implemented via a test button or switch S1, which may be manually pressed by the user. Pressing the test switch S1 is intended to cause the circuit interrupter 16 to trip and open the DPST switch 16B, thereby indicating that the GFI circuit 10 operates properly. Pressing the test switch S1 causes a small resistive load R1 to draw a current that bypasses the primary winding of the transformer T1. The bypass current has the same effect as leakage current in that the sum of the respective AC currents through the phase and neutral wires L, N, passing through the primary winding of the transformer T1 is non-zero. The non-zero current through the primary winding induces a current in the secondary winding 12 of the transformer T1, which is sensed by the control function 16A and opens the DPST switch 16B, thereby interrupting current paths over the phase and neutral wires L, N.

While leakage current is of concern in Information Technology (IT) equipment rooms, the conventional GFI circuit 10 is not a suitable solution to leakage current problems. IT equipment rooms (also known as data centers) utilize hundreds or even thousands of units of IT equipment. Each piece of IT equipment receives primary AC power by plugging into an outlet of a power distribution unit (PDU). A PDU is also a piece of IT equipment and typically includes: (a) a high power inlet from which power is received (typically from a panel board); (b) multiple lower power outlets; and (c) (optional) circuit breakers or fuses to protect the outlets from over current conditions (short circuits, etc.). PDUs are often designed to report certain status information over a communication and/or input/output interface, including: (a) the voltage being supplied to a given PDU's inlet, (b) how much power is flowing in the inlet and each outlet, and (c) the trip state (whether voltage is present) of each circuit breaker.

In a data center, it is not practical to use a standard GFI circuit 10 for a number of reasons. For example, it would be far too disruptive to unconditionally interrupt AC power to an IT device due to leakage current. Indeed, sensitive data may be corrupted and/or irrevocably lost if AC power were interrupted without notice. Additionally, industrial equipment (such as in data centers) may not be permitted to exhibit the same level of leakage current as those established in conventional residential GFI circuits 10. Indeed, the permissible level of leakage current in a data center (and/or other industrial environment) may be up to about 3.5 mA of current. Standard GFI circuits, however, may employ a fixed trip threshold for leakage current that is not appropriate for a data center. Still further, since data centers include thousands of units of IT equipment, it would be far too time-consuming, and susceptible to error, to manually test each GFI circuit 10.

Although the prior art systems address some issues associated with leakage current, the known solutions are unsatisfactory in the context of a data center (or other industrial environment). There are, therefore, needs in the art for new methods and apparatus for sensing ground leakage current in a system, and more particularly, for sensing such ground leakage and also operating to perform self-testing to ensure proper sensing capability.

SUMMARY OF THE INVENTION

In accordance with one or more aspects of the present invention described herein, a system for sensing leakage current includes one or more of the following features: (i) the ability to automatically, and preferably on a programmable, periodic basis, perform a self-test of the critical system hardware and/or software used to measure and monitor leakage current; (ii) the ability to permit an operator to set one or more leakage current levels, such as a warning level and/or a critical level; (iii) the ability to visually display a status indication of one or more leakage current conditions, such as an actual RMS leakage current measurement, an indication of a normal (or acceptable) leakage current level, an indication of a warning (e.g., elevated but not critical) leakage current level, an indication of a critical (e.g., an unacceptably, or near unacceptably, elevated) leakage current level, an indication that a self-test has uncovered faulty hardware and/or software; and (iv) the ability to dispatch notifications reporting the presence of one or more of the aforementioned status indications (and/or a change in such status), such as by way of the simple network management protocol (SNMP), e-mail, and/or other electronic means.

Other aspects, features, and advantages of the present invention will be apparent to one skilled in the art from the description herein taken in conjunction with the accompanying drawings.

DESCRIPTION OF THE DRAWINGS

For the purposes of illustration, there are forms shown in the drawings that are presently preferred, it being understood, however, that the invention is not limited to the precise arrangements and instrumentalities shown.

DETAILED DESCRIPTION OF THE PREFERRED EMBODIMENTS

Figure 1:
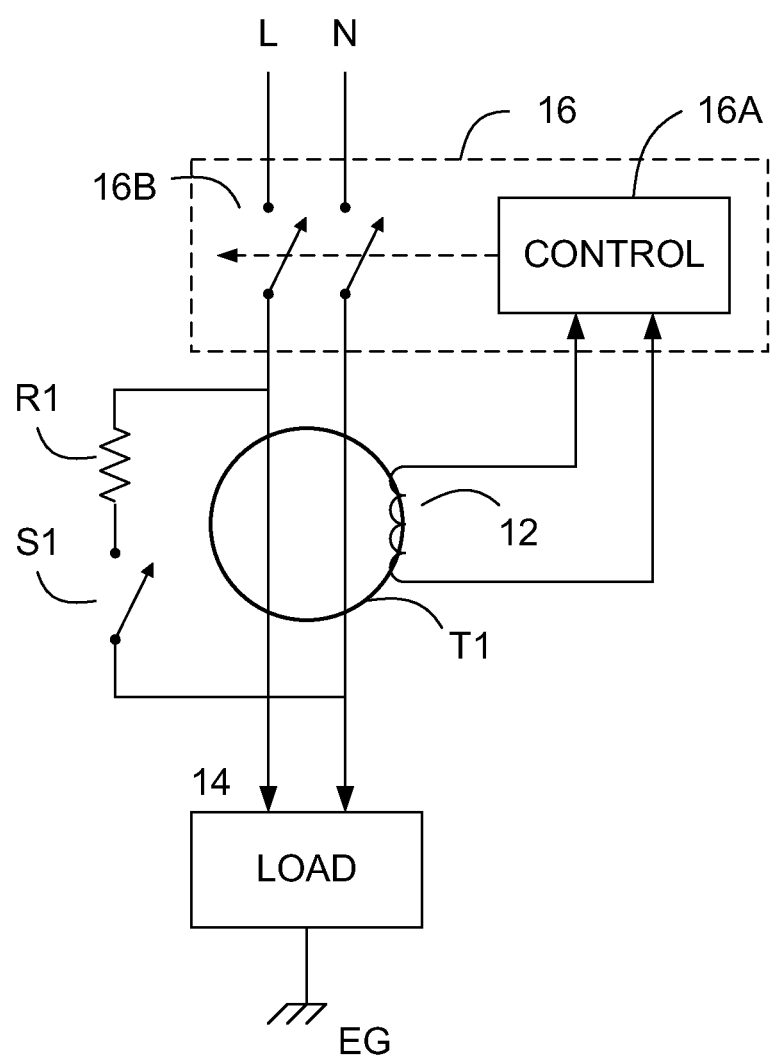
FIG. 1 is a block diagram of a conventional GFI circuit for sensing and interrupting AC power to a load when leakage current is present in accordance with the prior art.
Figure 2:
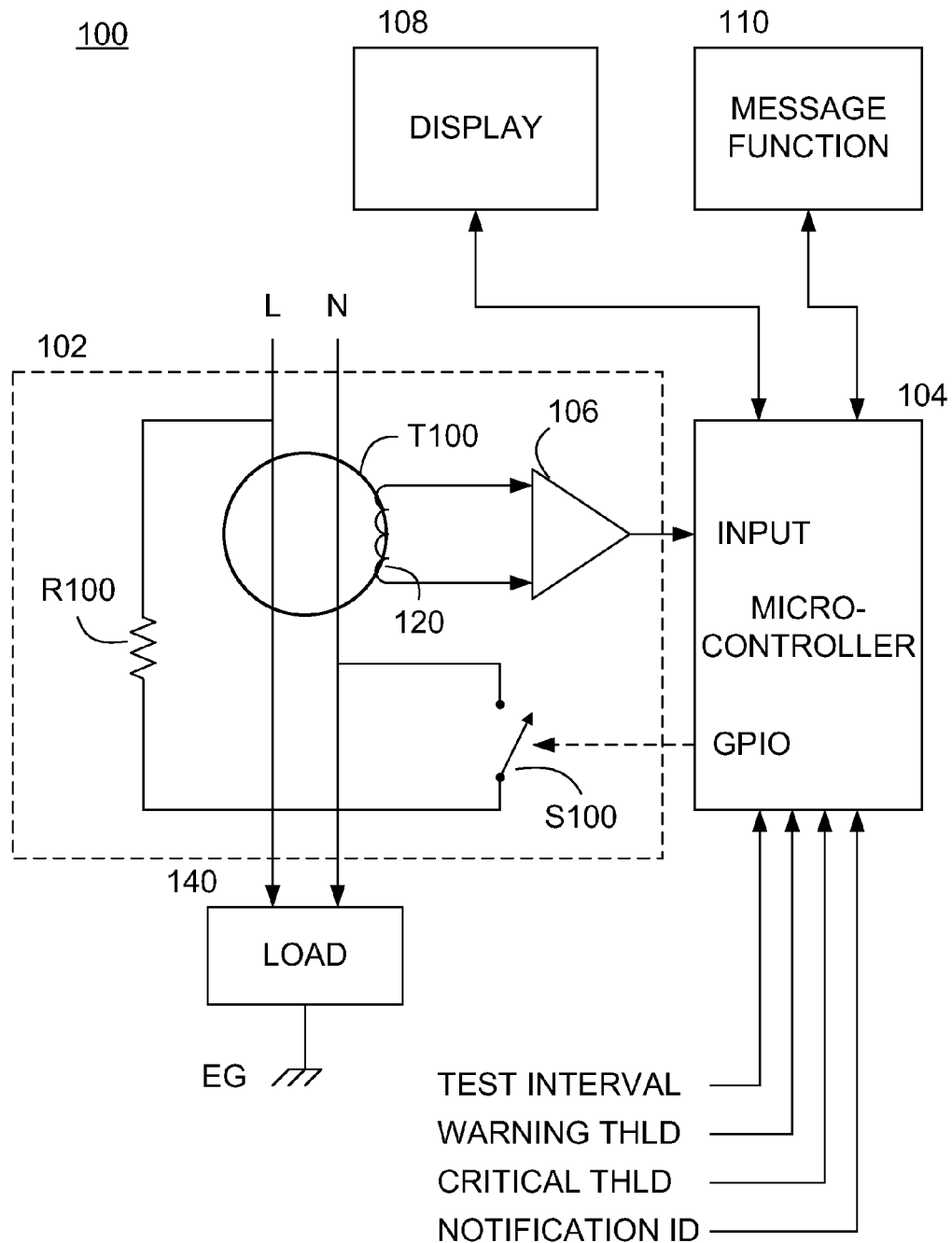
FIG. 2 is a block diagram of a leakage current sensing system in accordance with one or more aspects of the present invention.

With reference to the drawings wherein like numerals indicate like elements there is shown in FIG. 2 a block diagram of a system 100 in accordance with one or more aspects of the present invention. The system 100 includes a leakage current sensor 102, and a control circuit 104. The leakage current sensor 102 operates to measure leakage current from a source of AC power, which provides power to at least one load circuit 140. In accordance with one or more aspects of the present invention, it is specifically contemplated that the load circuit 140 includes one or more pieces of IT equipment in a data center.

The control circuit 104 operates to take certain action in response to received measured leakage current values from the leakage current sensor 102. The primary actions that the control circuit 104 circuit takes with respect to the received measured leakage current values are: (i) to compare the measured leakage current values against one or more predetermined thresholds to establish status therefor; and (ii) to perform one or more self tests to determine whether the leakage current sensor 102 is operative.

With regard to the former action, comparing the measured leakage current values against one or more predetermined thresholds, the operation of the system 100 is as follows. The AC source of power is coupled to the load 140 by way of a phase wire L and a neutral wire N. The leakage current sensor 102 includes a differential current transformer (T100), which includes a core, e.g., a toroidal core, through which the phase and neutral wires L, N pass. By passing through the center of the toroidal core of the transformer T100, the phase and neutral wires L, N establish a bifilar, single turn coil, which acts as a primary winding of T100. The secondary winding 120 includes a number of turns of wire wound around the core of the transformer T100. The secondary winding 120 is input into a signal conditioning circuit 106, such as current-to-voltage converter circuit, which produces a voltage indicative of the current induced into the secondary winding 120 of the transformer T100.

It is noted that, for purposes of discussion, the AC source of power is assumed to be a single phase source, where the legs of the AC source are the phase and neutral wires. It is understood, however, that the embodiments of the invention disclosed and described herein may be readily extended to other types of AC sources, including a split phase configuration, and/or a three phase source. In a split phase configuration, the legs are respective phase wires of a multi-phase AC source, such as line-1 and line-2; line-1 and neutral; or line-2 and neutral. In a three phase AC source, the legs may be line-1, line-2, and line-3; or line-1, line-2, line-3, and neutral. Indeed, for any of the other type of AC sources, the legs simply pass through the center of the toroidal core of the transformer T100, such that the legs form a multifilar, single turn coil, which acts as the primary winding of T100. Thus, while the embodiments illustrated in the figures and discussed herein are in the context of a single phase AC source, it is understood that any of such embodiments may readily be extended to operate with other types of AC sources.

The voltage induced into the secondary winding 120 of the transformer T100 is an indicator of the leakage current in the system 100. As discussed earlier in this description, without any leakage current, precisely the same magnitude of current flows in each of the phase and neutral wires L, N; however, each such magnitude of current is of opposite polarity flowing through the core. If leakage current is present, then such equal but opposite current flow does not exist with respect to the core, and some amount of current finds its way back to the AC source through another path, e.g., through earth ground, EG. When there is no leakage current, there is no net current flow in the primary winding of the transformer T100, which in turn results in no induced current in the secondary winding 120. The voltage produced by the signal conditioning circuit 106 is therefore substantially zero (although there may be some noise component in a practical circuit). When there is leakage current, however, the sum of the respective AC currents in the phase and neutral wires L, N through the core is not zero. The imbalance in current through the primary winding of the transformer T100 caused by the leakage current flow induces a current in the secondary winding 120 of the transformer T1.

The voltage produced by the signal conditioning circuit 106 is therefore some analog value indicative of the current in the secondary winding 120.

The control circuit 104 is preferably implemented by way of a suitable microcontroller, which operates to execute software/firmware instructions in order to achieve desirable operation of the system 100. Such a microcontroller 104 may include one or more high impedance input pins (labeled INPUT in FIG. 2) for receiving analog voltage signals, such as the voltage from the signal conditioning circuit 106. More particularly, the microcontroller 104 preferably includes at least one input pin that is set up to receive an analog voltage signal, and convert same to a digital signal for manipulation. In an alternative implementation, if the microcontroller 104 does not include suitable internal circuitry, an external analog-to-digital (A/D) converter (not shown) may be employed between the signal conditioning circuit 106 and a digital input pin of the microcontroller 104.

The microcontroller 104 may be implemented utilizing any of the known technologies, such as commercially-available microprocessors, digital signal processors, any of the known processors that are operable to execute software and/or firmware programs, programmable digital devices or systems, programmable array logic devices, or any combination of the above, including devices now available and/or devices which are hereinafter developed. By way of example, the microcontroller 104 may be implemented using the STM32 ARM MCU, which is available from a company called STMicroelectronics.

Software/firmware being executed by the microcontroller 104 is operable to mathematically manipulate the data presented at the INPUT terminal, which is a digitized version of the measured current induced into the secondary winding 120 of the transformer T100. Among such mathematical manipulations is preferably the aforementioned comparison of the measured leakage current values against one or more predetermined thresholds. In this regard, the microcontroller 104 operates to convert the digital values representing the current in the secondary winding 120 of the transformer T100 into an actual RMS value of the leakage current. This conversion formula will be well understood to a skilled artisan from the description herein. The conversion will be a function of the number of turns of the primary winding of the transformer T100, the number of turns of the secondary winding 120 of the transformer T100, and the transform characteristics of the signal conditioning circuit 106.

Figure 3:
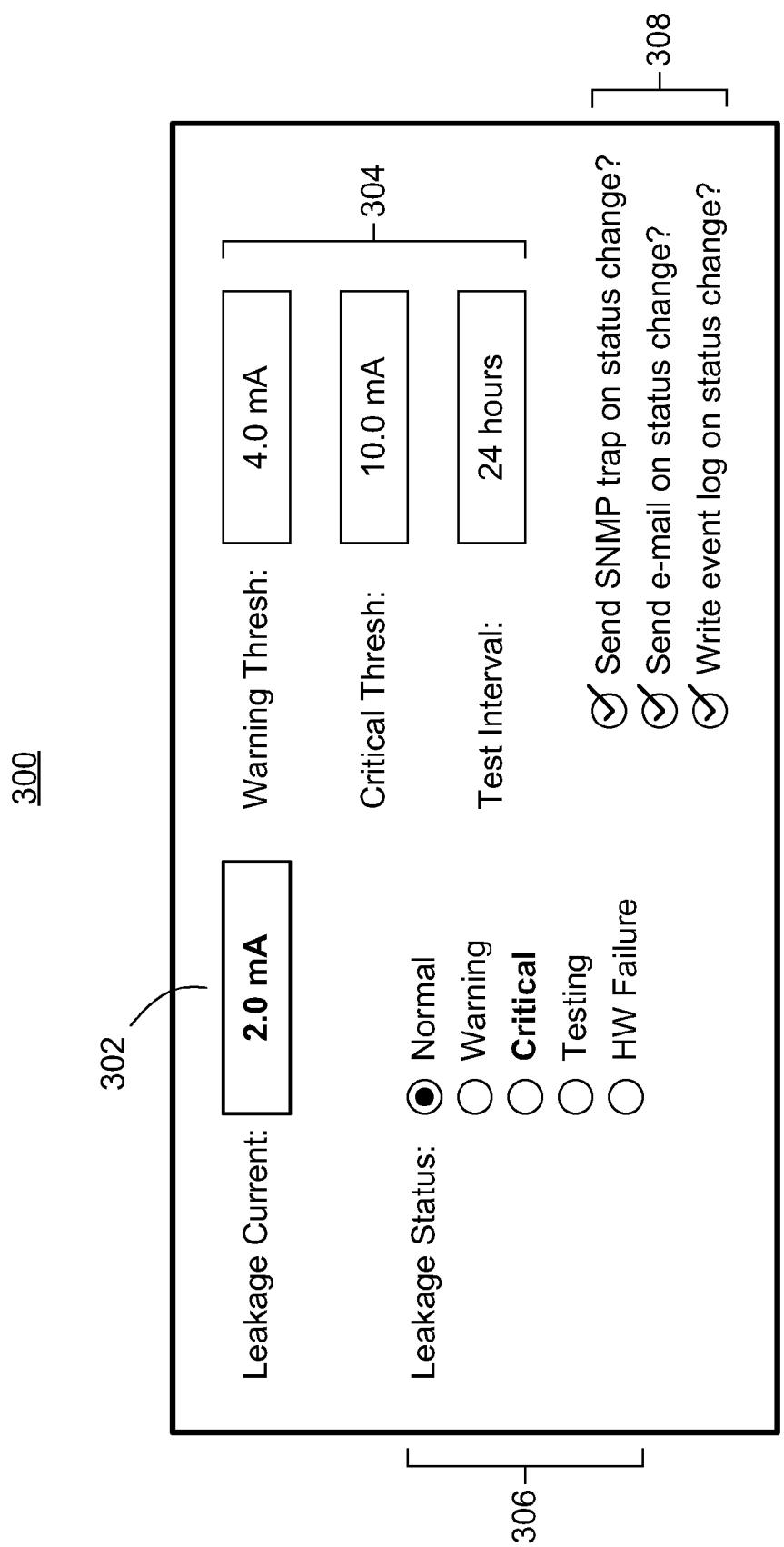
FIG. 3 is a generalized representation of a visual user-interface suitable for use in the leakage current sensing system of FIG. 2 and/or other embodiments disclosed and/or described herein.

In accordance with one or more aspects of the invention, and as illustrated in FIGS. 2 and 3, the system 100 may include a display 108 operatively coupled to the microcontroller 104, wherein the display 108 includes some type of screen 300 providing a visual indication of the measured leakage current values 302. Advantageously, an operator within the data center may easily obtain an indication as to the leakage current in the one or more pieces of IT equipment. It is further contemplated that a plurality of separate leakage current sensors 102 and/or microcontrollers 104 may be employed to separately measure leakage current in (and/or other functions discussed later herein) individual pieces of IT equipment or respective groups of such equipment.

Returning to the specific action of comparing the measured leakage current values against one or more predetermined thresholds, the microcontroller 104 operates to execute such function by way of the software/firmware running thereon. The system 100 may come pre-programmed with the one or more predetermined threshold levels. Preferably, however, the microcontroller 104 is programmable by the operator in order to set at least one of the one or more predetermined thresholds. In this regard, reference is made to FIGS. 3 and 4, the latter being a flow chart illustrating certain process steps and/or functions 400 of the system 100. In general, the process 400 is indicative of at least certain portions of the software/firmware running on the microcontroller 104 to achieve desirable operation of the system 100.

Figure 4:
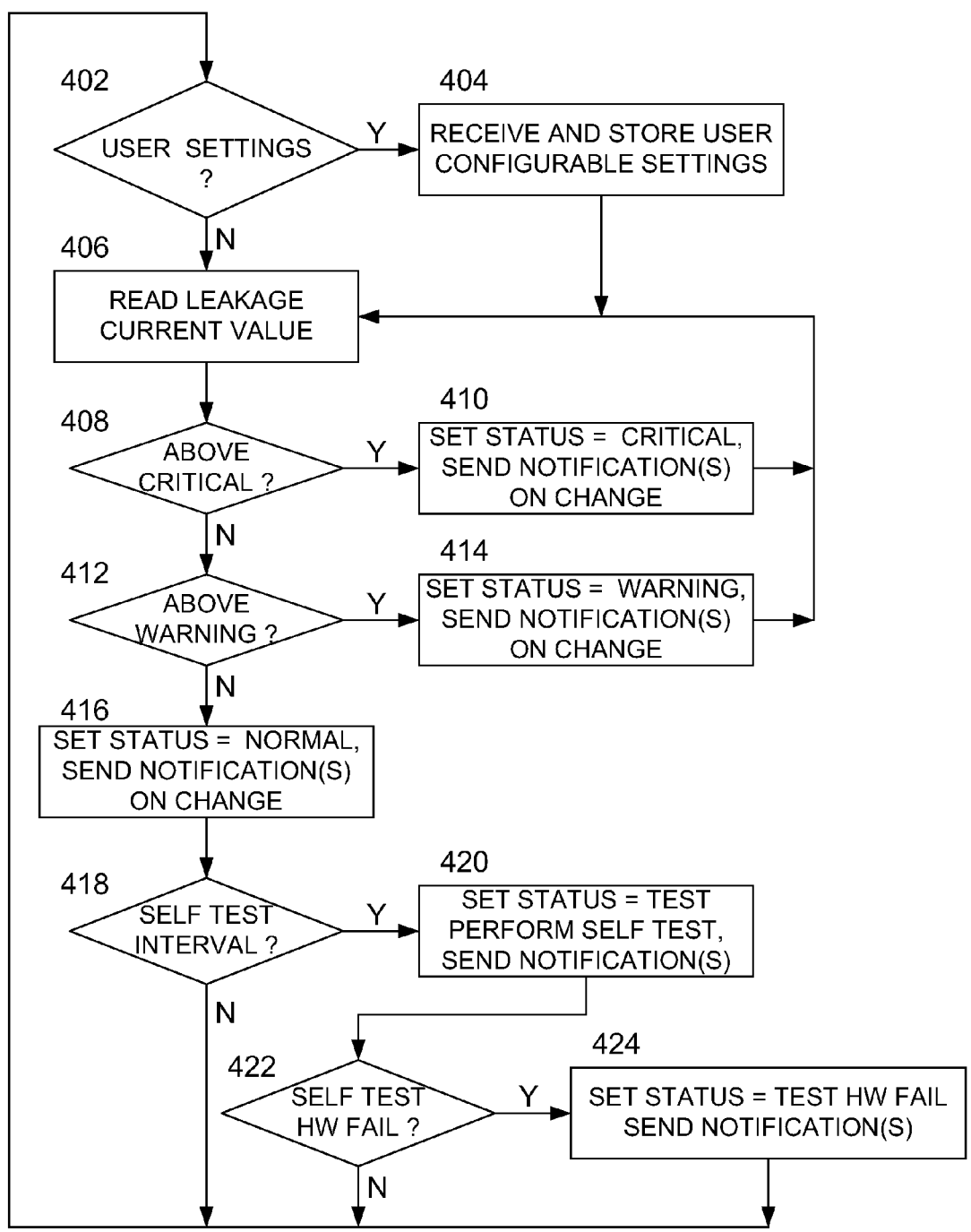
FIG. 4 is a diagram of a process flow that may be employed in the leakage current sensing system of FIG. 2 and/or other embodiments disclosed and/or described herein.

At action 402 of FIG. 4, the operator may be prompted to enter, or may proactively induce the microcontroller 104 to receive, certain settings, such as one or more predetermined thresholds. In this regard, if the operator is not permitted to set the one or more thresholds, the process flow branches in the negative to action 406. If, however, the operator is permitted to set the one or more thresholds, the process flow branches in the affirmative to action 404. By way of example, the operator may set a first threshold level indicating a leakage current, which if present would be higher than desired and/or otherwise excessive when considering the specifications of the particular application. The first threshold level may be considered a warning level because, even though the level is elevated, the system may continue to operate, the threat posed by the level may not be extreme, etc. By way of further example, the operator may set a second threshold level indicating a leakage current, which if present would be higher than the first threshold level, substantially higher than desired, and excessive when considering the normal operation of the particular system under measurement. The second threshold level may be considered a critical level because the system may not operate properly, the threat posed by the level may be unacceptable, etc.

At action 404, the settings for the first and second threshold levels are stored in memory (not shown) and used during the comparison process (as will be discussed below). In addition, as shown in FIG. 3, the first and second threshold levels may be displayed at location 304 of the display 108 as a warning level and a critical level, respectively. Notably, the levels listed at location 304 of the display 108 may indicate a dual function, both displaying the selected levels and operating as inputs of the operator's selection to the microcontroller 104, in which case the display 108 operates as an input/output device. Once action 404 is complete, the process flow continues to action 406.

At action 406, the microcontroller 104 reads the leakage current value (e.g., obtains a digital representation of the current in the secondary winding 120 of the transformer T100 and converts same into a value of measured leakage current, preferably an RMS value). Next, at action 408, the microcontroller 104 determines whether the measured value of leakage current is above the critical value. If negative, the process flow branches to action 412, where the microcontroller 104 determines whether the measured value of leakage current is above the warning level. An affirmative determination at action 408, or an affirmative or negative determination at action 412 will result in some conclusive status condition.

An affirmative determination at action 408 causes the process flow to branch to action 410 and indicates that the measured leakage current in the system is above the second threshold level, the critical level, which in this example is above 10 mA. At action 410 the microcontroller 104 sets the status level to critical and potentially takes further action. For example, upon a status of critical (and/or upon a change in status from something else to critical), the microcontroller 104 may operate to display the status on the display 108, such as at location 306, where the leakage status level, labeled "Critical", is highlighted. Alternatively or additionally, the microcontroller 104 may operate to store such status in an event log. The status may include the level (critical), the specific current magnitude, the threshold setting, the time, the date, the duration of the condition, etc. Thereafter, an operator and/or another program may access the event log via the microcontroller 104 in order to obtain the status data, consider same, and validate the ability of the system 100 to monitor the leakage current.

Additionally or alternatively, the microcontroller 104 may operate to send a notification of the status (or change in status) to one or more destinations. In this regard, the system 100 may include a message transmission system 110 coupled to the microcontroller 104 (and/or integral thereto), which operates to transmit one or more messages indicating the aforementioned status. Those skilled in the art will appreciate that the one or more messages may be of any number of specific protocol(s), such as: (i) a simple network management protocol, (ii) a packet switched network protocol, (iii) an electronic mail protocol, (iv) an instant messaging protocol, (v) a telephone protocol, and/or any other suitable protocol. Preferably, the message transmission system 110 is programmable by the operator to select the messaging protocol, and the display 108 shows a visual indication of the selected messaging protocol at location 308. Notably, the protocols listed at location 308 of the display 108 may provide a dual function, both displaying the selected protocol(s) and operating as inputs of the operator's selection to the microcontroller 104, in which case the display 108 operates as an input/output device.

Once the processes associated with action 410 are complete, the process flow loops back to action 406, where the process there is repeated so long as the critical status exists.

An affirmative determination at action 412 causes the process flow to branch to action 414 and indicates that the measured leakage current in the system is above the first threshold level (but not the second threshold level), i.e., the warning level, which in this example is above 4 mA but less than 10 mA. At action 414 the microcontroller 104 sets the status level to warning and potentially takes further action. For example, upon a status of warning (and/or upon a change in status from something else to warning), the microcontroller 104 may operate to display the status at location 306, by highlighting the level labeled "Warning". Alternatively or additionally, the microcontroller 104 may operate to store such status in an event log, which may include one or more of the level (warning), the specific current magnitude as measured, the threshold setting, the time, the date, the duration of the condition, etc. Additionally or alternatively, the microcontroller 104 may operate to send a notification of the status (or change in status) to one or more destinations in a manner similar to that discussed above with respect to the status of critical.

Once the processes associated with action 414 are complete, the process flow loops back to action 406, where the process there is repeated so long as the warning status exists.

Further, a negative determination at action 412 causes the process flow to branch to action 416 and indicates that the measured leakage current in the system is not above the first or second threshold levels, i.e., the normal level, which in this example is below 4 mA. At action 416 the microcontroller 104 sets the status level to normal. Possible further action includes one or more of: (i) displaying the status at location 306, by highlighting the level labeled "Normal", (ii) storing such status in an event log, and (iii) sending a notification of the status (or change in status) to one or more destinations.

Once the processes associated with action 416 are complete, the process flow advances to action 418. Returning to an earlier discussion of the primary actions that the microcontroller 104 takes with respect to the received measured leakage current values, the second general action is preferably performing (preferably automatically) one or more self tests to determine whether the leakage current sensor 102 is operative. Before discussing the specific functions and aspects associated with action 418 et seq., a discussion of the structure and operation of the system 100 as concerns self testing capabilities will be presented.

Turning to FIG. 2, the system 100 includes a means for self testing the leakage current sensing capabilities of the system 100. In particular, the leakage current sensor 102 includes a switch circuit S100 that turns on and off in response to a control signal, GPIO, output from the microcontroller 104, and a resistance R100. The switch circuit T100 and the resistance R100 are coupled in series between the phase wire L and the neutral wire N, such that an unbalanced flux is produced within the core of the transformer T100 when the switch S100 turns on. In the example shown, the series switch S100 and resistance R100 are configured such that current flowing therethrough bypasses the core of the transformer T100. Thus, the current flowing in the phase wire L and the neutral wire N will not be equal but opposite through the core, thereby creating an additional component of flux in the core that induces a current in the secondary winding 120 of the transformer T100. The value of the resistance R100 is chosen such that the induced current in the secondary winding 120 is sufficient to test the leakage current sensing capabilities of the system 100.

The software/firmware of the microcontroller is preferably operable to establish the proper potential on the switch circuit S100 (which may be implemented using one or more transistors, such as a MOSFET, etc.) in order to turn same on an off. The GPIO pin may be capable of operating as an output, where the state of the GPIO pin may be OFF or ON, depending on the commands established by software/firmware being executed on the microcontroller 104. The OFF state is defined as a logic "low" level, which may be any suitable voltage potential (often about 0 volts, or ground), and in such state the GPIO pin is capable of sinking current (into a relatively low impedance). The ON state is defined as a logic "high" level, which again may be any suitable voltage potential. The actual voltage of the GPIO pin in the ON state is often dictated by the operating DC supply voltage to the microcontroller 104. By way of example, such logic high voltage level may be anywhere between about 0.333 to about 5 VDC (with reference to ground), although lower and higher voltage levels are also possible. In the ON state, the GPIO pin is capable of sourcing current at the logic high voltage level (from a relatively low source impedance).

The implementation of the switch circuit S100 will establish that the switch turns on upon an ON state of the GPIO pin and that the switch turns off upon an OFF state of the GPIO pin. It is noted that the specific implementation of the switch circuit S100 will dictate whether the switch turns on in response to the GPIO in the ON state or the OFF state, either relationship will suffice. When the switch circuit S100 turns on and current is induced into the secondary winding 120, the microcontroller 104 measures the faux leakage current and compares same to a threshold level, which may be one of the aforementioned warning and/or critical levels, and/or may be another level specific to a self test.

Turning again to FIGS. 3 and 4, at action 418, a determination is made as to whether the conditions are ripe for a self test procedure. By way of example, the conditions may include a time, date, interval, and/or other metric. In some embodiments, it is desirable to conduct the self test periodically, such as every 24 hours. In this regard, the operator may set the conditions for self test at action 402 (discussed above with respect to settings), and such setting(s) may be displayed at location 304. Again, if the display 108 operates as an input/output device, the operator may set the self test conditions (in this example an interval of 24 hours) through manipulation of the screen 300 or other input element of the display 108.

An affirmative determination at action 418 causes the process flow to branch to action 420 and indicates that the status of the system 100 is in self test mode. The display 108 may indicate the self test mode at location 306 (FIG. 3) by highlighting the label "Testing". As discussed above, the software/firmware may produce a control signal on the GPIO pin of the microcontroller 104, which turns on the switch circuit S100. The microcontroller 104 then compares the measured leakage current to one or more thresholds, such as 4 mA, 10 mA, and/or other thresholds. The process then advances to action 422, where a determination is made as to whether the result of the comparison at action 420 indicates that the leakage current sensing circuitry failed the self test. If the result of the determination is negative (i.e., that the test passed), then the process flow loops back to action 402, where the process flow repeats. If, however, the result of the determination is positive (i.e., that the test failed), then the process flow advances to action 424.

At action 424 the microcontroller 104 sets the status to hardware failure and potentially takes further action. For example, upon a status of hardware failure (and/or upon a change in status from something else to such), the microcontroller 104 may operate to display the status at location 306, by highlighting the label "HW Failure". Alternatively or additionally, the microcontroller 104 may operate to store such status into an event log, which may include one or more of the test current measurement, the threshold(s), the time, the date, the duration of the condition, etc. Additionally or alternatively, the microcontroller 104 may operate to send a notification of the status (or change in status) to one or more destinations in a manner similar to that discussed above. After completing the processes of action 424, the process flow loops back to action 402, where the process flow repeats.

Figure 5:
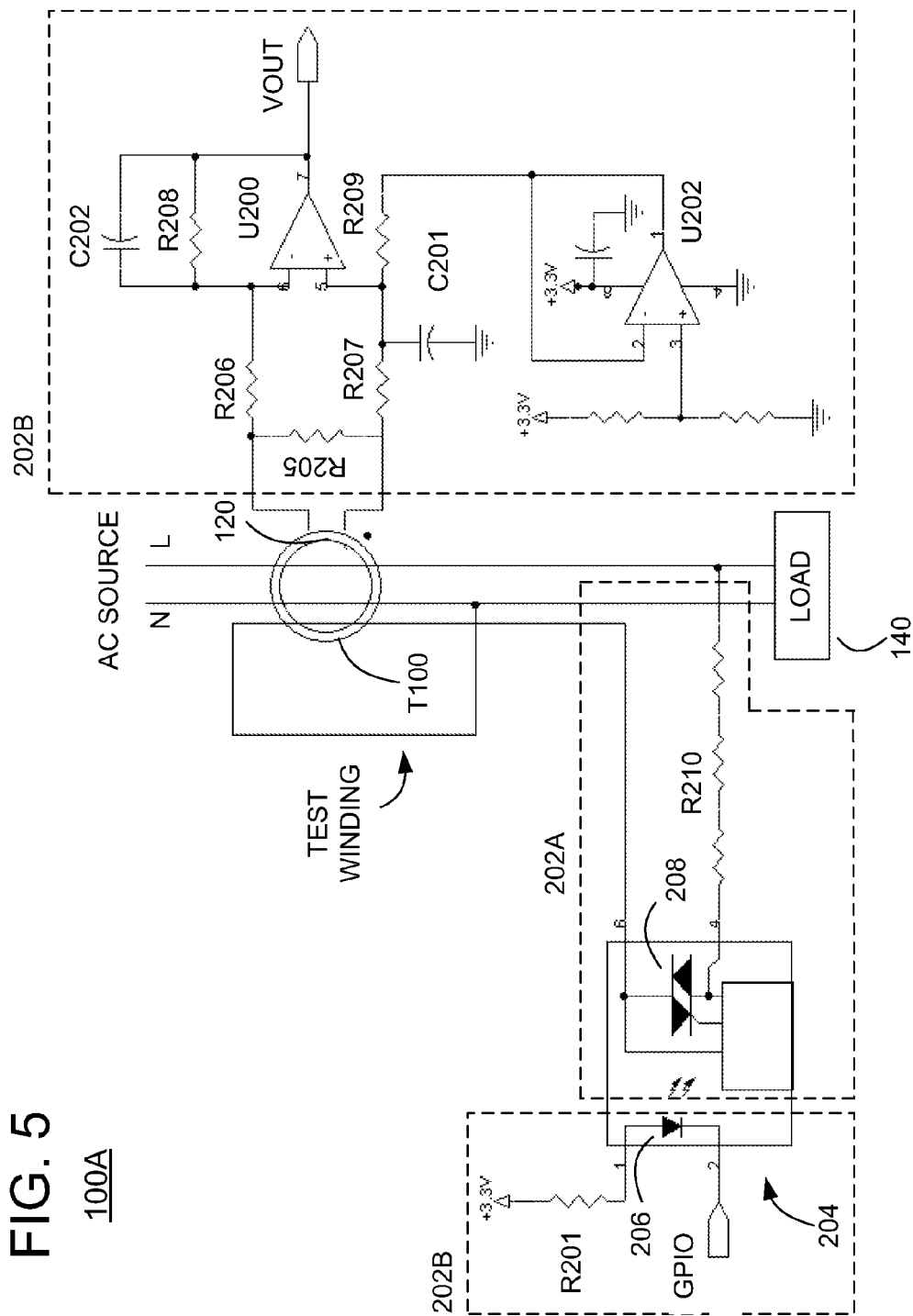
FIG. 5 is a more detailed schematic diagram of a circuit that is suitable for implementing the leakage current sensing system of FIG. 2 and/or other embodiments disclosed and/or described herein.

Reference is now made to FIG. 5, which illustrates a more detailed schematic diagram of a circuit suitable for implementing the systems discussed above, and/or other embodiments disclosed or described herein. In many ways the system 100A is similar to the system 100 discussed above. A more specific (and/or alternative) example for implementing the leakage current sensor is illustrated in FIG. 5.

In the system 100A, the source of AC power and the load circuit 140 are on a primary side of an electrical isolation boundary, and the microcontroller 104 is on a secondary side of the electrical isolation boundary. Maintaining the isolation boundary is desirable, and often required by law or specification, to protect operators using/maintaining the load 140 and/or the microcontroller 104 from shock or other hazards associated with the AC source.

The leakage current sensor 202 includes a first circuit 202A on the primary side of the electrical isolation boundary, and a second circuit 202B on the secondary side of the electrical isolation boundary. Additionally, the leakage current sensor 202 includes one or more third circuits that inter-couple the first and second circuits 202A, 202B of the leakage current sensor 202, yet maintain the electrical isolation boundary therebetween. In this example, the one or more third circuits include the differential current transformer T100 and an isolator circuit 204. The differential current transformer T100 maintains isolation because there is no direct connection from the secondary winding 120 to the primary winding (the phase and neutral wires L, N). The transformer includes one or more turns of the phase and neutral wires L, N in a bifilar configuration, and a plurality of turns on secondary winding 120 to establish a 1000:1 turns ratio.

Similarly, the isolator circuit 204 maintains isolation because there is no direct connection from the primary side to the secondary side. In particular, the isolator circuit 204 includes a primary side circuit 208, and a secondary side circuit 206. The primary side circuit 208 operates to induce an unbalanced flux in the transformer core that produces a current in the secondary winding 120 of the differential current transformer T100. The unbalanced flux is in response to an intermediate control signal (within the isolator circuit 204) crossing the electrical isolation boundary from the secondary side thereof. In this example, the isolator circuit 204 includes a light emitting device in the secondary side circuit 206, which produces light when activated by the microcontroller 104 (not shown). The intermediate control signal (the light) crosses the electrical isolation boundary from the secondary side to the primary side thereof. The isolator circuit 204 also includes a light sensitive switch circuit (in this example a TRIAC) in the primary side circuit 208 that turns on and off in response to the light of the intermediate control signal. The light emitting device 206 is the LED cathode of the TRIAC, and is connected to the GPIO pin of the microcontroller 104. When the microcontroller 104 sets the GPIO pin to the OFF state, a current flows through R201 and the LED 206 of the TRIAC, which causes the light sensitive switch 208 of the TRIAC to turn on.

The leakage current sensor 202 includes an additional test winding on the transformer T100 that produces the unbalanced flux in the transformer core in response to the light sensitive switch circuit 208 turning on. In particular, the light sensitive switch circuit 208, the test winding and a resistance R210 (in this example implemented using a plurality of resistors) are coupled in series between the phase wire L and the neutral wire N, such that the unbalanced flux is produced in response to the intermediate control signal (the light) turning on the switch circuit 208. The current flowing through the test winding induces the unbalanced flux, thereby generating the induced current in the secondary winding 120 of the transformer T100. The net result of turning on the switch 208 of the TRIAC is to cause a self-test (faux) leakage current equal to V×T/R, where V is the primary AC voltage, T is the number of turns (e.g., about one or two) of the test winding about the core, and R is the resistance. For example, if V=230, T=1, and R=3990, a leakage current of 5.76 mA will be generated.

The secondary side circuit 206 includes a burden resistor R205, which may be about 100 ohms. The voltage produced across the burden resistor R205 is equal to 0.1× the actual leakage current, which adheres to the following equation:

$$V = I_{LEAK}/N \times R205,$$

where ILEAK is the leakage current, N is transformer turns ratio, and R205 is value of the burden resistor in ohms.

The differential voltage, V, across R205 is converted to a single-ended voltage output by operational amplifier U200. The operational amplifier U200 is configured as a differential amplifier with a gain of 100 (as set by the ratios R208/R206 and R209/R207). Assuming that resistors R208=R209=100K, and R206=R207=1K, this results in an output voltage, VOUT=10×ILEAK, which is input into the microcontroller 104, preferably the ADC input thereof. To eliminate or reduce high frequency noise pickup, capacitors C201 and C202 (e.g., about 1.5 nF) are included to form a first order low pass filter with a cut-off frequency of about 1000 Hz. The operational amplifier U202 is configured as a buffer and provides a bias point for U200. By way of example, the components of the operational amplifier U202 may be established to produce a bias point of about 1.65 volts. Assuming the example of a test leakage current of 5.76 mA, a 57.6 mV signal will be produced at the output of U200.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An apparatus, comprising:
   a leakage current sensor configured to measure leakage current from a source of AC power on a primary side of an electrical isolation boundary, which provides power to at least one load circuit on said primary side of said electrical isolation boundary;
      said leakage current sensor including (i) a first circuit on the primary side of the electrical isolation boundary; (ii) a second circuit on a secondary side of the electrical isolation boundary; and (iii) a third circuit that inter-couples the first and second circuits of the leakage current sensor while maintaining the electrical isolation boundary therebetween, including at least
      (a) a differential current transformer having a primary winding formed by one or more equal numbers of turns of respective legs about a transformer core as such legs pass from the source of AC power to the at least one load circuit, and a secondary winding formed by a plurality of turns of wire about the transformer core; and
      (b) an isolator circuit having:
         (1) a primary side circuit operating to induce an unbalanced flux in the transformer core that produces a current in the secondary winding of the differential current transformer, the unbalanced flux being in response to an intermediate control signal crossing the electrical isolation boundary from the secondary side thereof; and
         (2) a secondary side circuit operating to produce the intermediate control signal in response to a test control signal produced by a control circuit, said secondary side circuit including a switch circuit that turns on and off in response to the intermediate control signal; a test winding of one or more turns on the differential current transformer; and a resistance; wherein the switch circuit, test winding, and resistance are coupled in series between the legs such that the unbalanced flux is produced in response to the intermediate control signal turning the switch circuit on; and
   a control circuit on a secondary side of the electrical isolation boundary configured to: (i) receive measured leakage current values from the leakage current sensor at least at some times other than during a self test of the leakage current sensor, (ii) compare the measured leakage current values against a plurality of predetermined thresholds at least at some times other than during a self test of the leakage current sensor; (iii) provide a status output indicating the status of leakage current with respect to said plurality of thresholds; and (iv) perform a self test to determine whether the leakage current sensor is operative by providing said test control signal.

2. The apparatus of claim 1, wherein:
   the control circuit is programmable by an operator in order to set at least one of the predetermined thresholds;
   the predetermined thresholds include at least one of: (i) a first threshold level indicating a measure leakage current that is excessive; and (ii) a second threshold level, higher than the first threshold level; and
   the control circuit operates to store and retrieve results of the comparisons of the measured leakage current values against the predetermined thresholds.

3. The apparatus of claim 2, wherein at least one of:
   the control circuit is programmable by an operator in order to set at least one of: (i) periodic self test time intervals; (ii) one or more dates of the self tests, and (iii) one or more times for the self tests; and
   the control circuit operates to store and retrieve results of one or more of the self tests for validation of the leakage current sensor.

4. The apparatus of claim 3, wherein the control circuit operates to store into an event log at least one of: the results of one or more of the self tests; and the comparisons of the measured leakage current values against the one or more predetermined thresholds.

5. The apparatus of claim 4, wherein the control circuit operates to store the status indicators into the event log, including at least one of:
   whether the measured leakage current values are at normal levels, because the comparison indicates that the measured leakage current values are below the first threshold level;
   whether the measured leakage current values are at warning levels, because the comparison indicates that the measured leakage current values are above the first threshold level but below the second threshold level;
   whether the measured leakage current values are at critical levels, because the comparison indicates that the measured leakage current values are above the second threshold level;
   whether a self test is in progress;
   whether results of one or more self tests indicate that the leakage current sensor is non-operative; and
   whether results of one or more self tests indicate that the leakage current sensor is operative.

6. The apparatus of claim 3, further comprising a display operatively coupled to the control circuit, wherein the display shows a visual indication of at least one of:
   the measured leakage current values;
   the first threshold level;
   the second threshold level;
   the periodic self test time intervals;
   the one or more dates of the self tests; and
   the one or more times for the self tests.

7. The apparatus of claim 3, further comprising a display operatively coupled to the control circuit, wherein the display shows a visual indication of the status, the status including at least one of:
   whether the measured leakage current values are at normal levels, because the comparison indicates that the measured leakage current values are below the first threshold level;
   whether the measured leakage current values are at warning levels, because the comparison indicates that the measured leakage current values are above the first threshold level but below the second threshold level;

whether the measured leakage current values are at critical levels, because the comparison indicates that the measured leakage current values are above the second threshold level;

whether a self test is in progress;

whether results of one or more self tests indicate that the leakage current sensor is non-operative; and whether results of one or more self tests indicate that the leakage current sensor is operative.

8. The apparatus of claim 3, further comprising a message transmission system coupled to the control circuit and operating to transmit one or more messages indicating at least one of: the results of one or more of the self tests; and the comparisons of the measured leakage current values against the one or more predetermined thresholds.

9. The apparatus of claim 8, wherein the message transmission system is operable to send the one or more messages in at least one of: (i) a simple network management protocol, (ii) a packet switched network protocol, (iii) an electronic mail protocol, (iv) an instant messaging protocol, and (v) a telephone protocol.

10. The apparatus of claim 9, wherein the message transmission system is programmable by an operator to select the messaging protocol.

11. The apparatus of claim 10, further comprising a display operatively coupled to the control circuit, wherein the display shows a visual indication of the selected messaging protocol.

12. The apparatus of claim 9, wherein the status indicators include at least one of:

whether the measured leakage current values are at normal levels, because the comparison indicates that the measured leakage current values are below the first threshold level;

whether the measured leakage current values are at warning levels, because the comparison indicates that the measured leakage current values are above the first threshold level but below the second threshold level;

whether the measured leakage current values are at critical levels, because the comparison indicates that the measured leakage current values are above the second threshold level;

whether a self test is in progress;

whether results of one or more self tests indicate that the leakage current sensor is non-operative; and whether results of one or more self tests indicate that the leakage current sensor is operative.

13. A method, comprising:

measuring leakage current from a source of AC power, which provides power to at least one load circuit, said source of AC power and said load circuit being on a primary side of an electrical isolation boundary;

comparing the measured leakage current values against a plurality of predetermined thresholds;

providing a status output indicating the status of leakage current with respect to said plurality of thresholds; and automatically performing self tests to determine whether the leakage current measuring and comparing operations are operative, wherein comparing the measured leakage current values and providing a status output are performed on a secondary side of said electrical isolation boundary electrically isolated from the primary side, and performing self tests is triggered by a test control signal from said secondary side of said isolation boundary.

14. The method of claim 13, further comprising permitting an operator set at least one of:

the plurality of predetermined thresholds; and timing at which the self tests are performed.

15. The method of claim 14, wherein the predetermined thresholds include at least one of: (i) a first threshold level indicating a measure leakage current that is higher than desired; and (ii) a second threshold level, higher than the first threshold level; and the timing at which the self tests are performed include at least one of: (i) periodic self test time intervals; (ii) one or more dates of the self tests, and (iii) one or more times for the self tests.

* * * * *